United States Patent [19]

Umemoto

[11] Patent Number: 4,853,043
[45] Date of Patent: Aug. 1, 1989

[54] SOLAR BATTERY FOR TIME PIECE

[75] Inventor: Yoshiyuki Umemoto, Kanagawa, Japan

[73] Assignee: Fuji Electric Company, Ltd., Kanagawa, Japan

[21] Appl. No.: 282,933

[22] Filed: Dec. 8, 1988

Related U.S. Application Data

[63] Continuation of Ser. No. 170,649, Mar. 16, 1988, abandoned, which is a continuation of Ser. No. 917,547, Oct. 10, 1986, abandoned.

[30] Foreign Application Priority Data

Oct. 14, 1985 [JP] Japan ................................ 60-228337

[51] Int. Cl.⁴ ............................................. H01L 27/14
[52] U.S. Cl. ....................................... 136/244; 437/4; 136/258
[58] Field of Search ........................................ 136/244

[56] References Cited

FOREIGN PATENT DOCUMENTS

| 52-17782 | 2/1977 | Japan | 136/244 |
|---|---|---|---|
| 56-78180 | 6/1981 | Japan | 136/244 |
| 58-182279 | 10/1983 | Japan | 136/258 AM |
| 59-124175 | 7/1984 | Japan | 136/244 |

Primary Examiner—Aaron Weisstuch
Attorney, Agent, or Firm—Finnegan, Henderson, Farabow, Garrett and Dunner

[57] ABSTRACT

A solar battery for a time piece comprises an insulated substrate; a plurality of generating regions arranged in a circular pattern around a single point on the insulated substrate, each region including a non-crystalline semiconductor film, and upper and lower electrodes on opposite sides of the film; and connecting layers for reducing the power loss of the battery, including overlapping side areas at surfaces between adjacent regions and overlapping perimeter areas at surfaces on the perimeter of adjacent regions, for joining the upper and lower electrodes of adjacent regions, respectively.

5 Claims, 1 Drawing Sheet

SOLAR BATTERY FOR TIME PIECE

This application is a continuation of application Ser. No. 170,649, filed Mar. 16, 1988, now abandoned, which was a continuation of application Ser. No. 917,547, filed Oct. 10, 1986 now abandoned.

BACKGROUNDS OF THE INVENTION

This invention relates to solar batteries for time pieces, and more particularly to solar batteries in which a plurality of generating regions formed by upper and lower electrodes on a noncrystalline semiconductor film, such as an amorphous silicon film (hereinafter referred to as an "a-Si film", when applicable), are arranged around one point on the substrate.

The photoelectric conversion efficiency of a solar battery depends mainly on the internal resistance of the solar battery. In particular, it depends on the series resistance of the upper and lower electrodes which are formed on both sides of an a-Si film or the like, and the series resistance of the elongation of the upper and lower electrodes which are brought into contact with each other in order to connect adjacent generating regions.

Heretofore, two methods have been employed to connect the generating regions. In one of the methods, as shown in FIG. 2, a first generating region consisting of a lower electrode 21, and a-Si film 31 and an upper electrode 41, and a second generating region consisting of a lower electrode 22, an a-Si film 32 and an upper electrode 42 are provided on an insulated substrate 1. The first and second generating regions are adjacent to each other, and the upper electrode 41 of the first generating region and the lower electrode 22 of the second generating region are elongated in the direction of arrangement of these regions, so as to be brought into contact with each other. In the other method, as shown in FIG. 3, a lower electrode 21 and an upper electrode 41, and a lower electrode 22 and an upper electrode 42 are provided on an insulated substrate 1. The lower electrode 21 confronts with the upper electrode 41 through an a-Si film 32, and the lower electrode 22 also confronts with the upper electrode 42 through the same a-Si film 32, and the lower electrode 21 and the upper electrode 42 are elongated in a direction perpendicular to the direction of arrangement of the generating area so as to be brought into contact with each other. In the method shown in FIG. 2, the power loss p of the upper and lower electrodes can be represented by the following equation:

$$p = \tfrac{1}{3} I^2 R (w/x)$$

where I is the current, R is the sheet resistance of the electrode, x is the length of a generating region, and w is the width of the same.

As is apparent from the equation, if the current and the sheet resistance are constant, the power loss is proportional to the ratio of the width of the generating region to the length of the same. However, in most of the solar batteries for time pieces, as shown in FIG. 4, the total area, the arrangement of generating regions 10, 20, 30, and 40 and the direction of current indicated by the arrows 7 are predetermined. Therefore there is no degree of freedom to determine the ratio of w/x. That is, there is no degree of freedom in design to decrease the power loss in the total area.

Accordingly, it is an object of this invention to eliminate the above-described difficulty accompanying conventional solar batteries for time pieces. More specifically, an object of the invention is to decrease the power loss of the upper and lower electrodes of a solar battery for time pieces, and especially the power loss of transparent electrodes which are high in sheet resistance.

Additional objects and advantages will be set forth in part in the description which follows, and in part will be obvious from the description.

SUMMARY OF THE INVENTION

To achieve the foregoing objects and advantages, the solar battery of the present invention comprises an insulated substrate; a plurality of generating regions arranged in a circular pattern around a single point on the insulated substrate, each region including a non-crystalline semiconductor film, and upper and lower electrodes on opposite sides of the film; and connecting means for reducing the power loss of the battery, including overlapping areas at surfaces between adjacent regions, and overlapping perimeter areas at surfaces on the perimeter of adjacent regions, for joining the upper and lower electrodes of adjacent regions, respectively.

Preferably, the non-crystalline film includes amorphous silicon. It is also preferred that the lower electrode include a composition selected from the group consisting of tin oxide, indium oxide, and indium tin oxide. The upper electrode preferably includes aluminum, and the substrate preferably includes glass.

BRIEF DESCRIPTION OF THE DRAWINGS

The accompanying drawings, which constitute a part of the specification, illustrate several embodiments of the invention, and together with the description, serve to explain the principles of the invention.

DETAILED DESCRIPTION OF THE PREFERRED EMBODIMENT

Reference will now be made in detail to the present preferred embodiment of the invention, an example of which is illustrated in the accompanying drawings.

Figure 1:
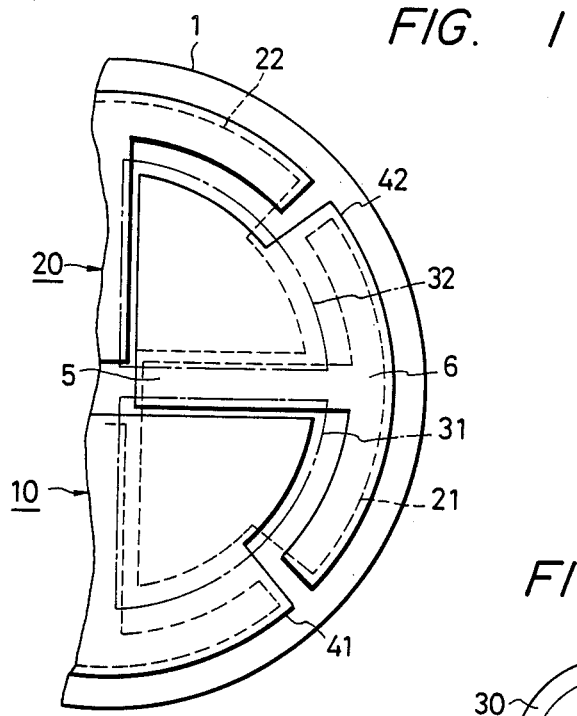
FIG. 1 is a plan view showing a part of the solar battery for a time piece which is one embodiment of this invention.
Figure 4:
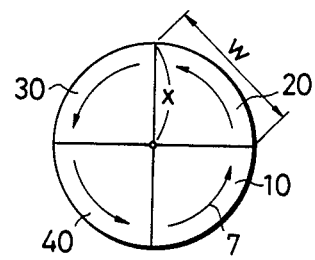
FIG. 4 is a plan view showing one example of the arrangement of generating regions in a solar battery for time pieces.
Figure 2:
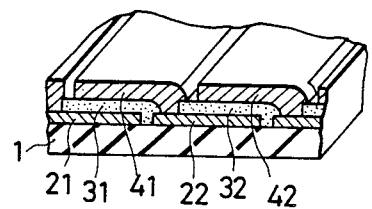
FIGS. 2 and 3 are perspective views, with parts cut away, showing different methods of connecting generating regions in a conventional solar battery for time pieces.
Figure 3:
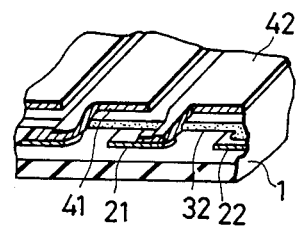

FIG. 1 shows one embodiment of the invention. In FIG. 1, parts corresponding functionally to those already described with reference to FIGS. 2 and 3 are therefore designated by the same reference numerals or characters.

As shown in FIG. 1, a lower electrode 21, and a-Si film 31 and an upper electrode 41 are formed on an insulated substrate 1, thus providing a first generating region 10. Similarly, a lower electrode 22, an a-Si film 32, and an upper electrode 42 are formed on the insulated substrate 1, thus providing a second generating region 20. The two generating regions 10 and 20 are connected to each other by employing a combination of two methods. First, similar to the method described with reference to FIG. 2, the lower electrode 21 and the upper electrode 42 are elongated to the middle area 5, where they are laid on each other. Next, similar to the method described with reference to FIG. 3, the lower electrode 21 and the upper electrode 42 are elongated to the area 6 outside the generating regions. If, in this connection, for instance the substrate 1 is made of a glass plate, the lower electrodes 21 and 22 are made of tin oxide, indium oxide, or indium tin oxide, and the upper electrodes 41 and 42 are made of aluminum, the lower electrodes are higher in sheet resistance than the upper electrodes. Therefore, the resistance may be decreased by making the elongation of the lower electrode to the outside connecting area 6 larger in width than that of the upper electrode. In the case where the upper electrodes are higher in sheet resistance than the lower electrodes, the resistance may be decreased by making the elongation of the upper electrode larger in width than that of the lower electrode.

According to the invention, a plurality of generating regions arranged around one point of a solar battery for time pieces which has no degree of freedom in design are connected in the middle area of adjacent generating regions, and in the area outside the generating regions. Therefore, the distance between the generating area and the connecting part is decreased and the resistance also is decreased. Furthermore, as the connecting part is increased in area, the connecting resistance is decreased. Thus, the solar battery for time pieces according to the invention is low in series resistance and excellent in electrical characteristics. Various modifications and variations may be made in the invention without departing from the scope or spirit of the invention.

According to the invention, FIG. 1 illustrates a solar battery for a time piece comprising an insulated substrate, and a plurality of generating regions arranged in a circular pattern around a first point on the insulated substrate. Each region includes a non-crystalline semiconductor film, and upper and lower electrodes on opposite sides of the film. Each of the electrodes has first through seventh sides, with the first and second sides extending radially from a second point. The third and seventh sides extend from the second and first sides, respectively, and the fourth and sixth sides extend from the third to the fifth sides and from the seventh to the fifth sides, respectively. The fifth side extends from the fourth to the sixth sides. Connecting means for reducing the power loss of the battery are provided, including overlapping areas at surfaces between adjacent regions, and overlapping perimeter areas at surfaces on the perimeter of adjacent regions, for connecting the upper and lower electrodes of adjacent regions.

In another preferred embodiment, each of the upper electrodes is asymmetrical, and the lower electrodes are, in plan view, mirror images of the upper electrodes. In yet another preferred embodiment, the fifth side is substantially concentric with a perimeter of the insulated substrate. Still another preferred embodiment has the third side and the seventh side substantially concentric with the fifth side.

What is claimed is:

1. A solar battery for a time piece, comprising:
   an insulated substrate;
   a plurality of generating regions arranged in a circular pattern around a first point on the insulated substrate, each region including a non-crystalline semiconductor film, and upper and lower electrodes on opposite sides of the film;
   each of said electrodes including first through seventh sides, wherein
   said first and second sides extend radially from a second point;
   said third and said seventh sides extend from said second and first sides, respectively;
   said fourth and sixth sides extend from said third to said fifth sides and from said seventh to said fifth sides, respectively; and
   said fifth side is an arc having a length extending from said fourth of said sixth sides; and
   connecting means for reducing the power loss of the battery, including radially extending overlapping areas at surfaces between adjacent regions, and circumferentially extending overlapping perimeter areas at surfaces on the perimeter of adjacent regions, for connecting the upper and lower electrodes of adjacent regions
   wherein said circumferential areas extend substantially entirely along the arc length of said fifth sides of corresponding upper and lower electrodes of adjacent regions.

2. The solar battery of claim 1, wherein each of said upper electrodes is asymmetrical, and said lower electrodes are, in plan view, mirror images of said upper electrodes.

3. The solar battery of claim 1, wherein said insulated substrate has a circumference, said fifth side is substantially concentric with said circumference of said insulated substrate and a circumferential distance between adjacent circumferential areas is about equal to a radial distance between said fifth side and said circumference of said insulated substrate.

4. The solar battery of claim 3, wherein said third side and said seventh side are substantially concentric with said fifth side.

5. The solar battery of claim 1, wherein said circumferential area has a chord length, said radial area has a radial length, and said chord length is longer than said radial length.

* * * * *